(12) United States Patent
Shibano et al.

(10) Patent No.: US 6,413,682 B1
(45) Date of Patent: Jul. 2, 2002

(54) SYNTHETIC QUARTZ GLASS SUBSTRATE FOR PHOTOMASK AND MAKING METHOD

(75) Inventors: Yukio Shibano; Hisatoshi Otsuka, both of Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/576,006

(22) Filed: May 22, 2000

(30) Foreign Application Priority Data

May 21, 1999 (JP) .......................... 11-141213

(51) Int. Cl.$^7$ ................................ G03F 9/00
(52) U.S. Cl. ........................................ 430/5
(58) Field of Search .................... 430/5, 321; 359/350; 65/378, 426, 427, 32.2

(56) References Cited

U.S. PATENT DOCUMENTS 5,325,230 A * 6/1994 Yamagata et al. .......... 359/350

6,242,136 B1 * 6/2001 Moore et al. ................. 430/5

FOREIGN PATENT DOCUMENTS

| EP | 0 401 845 | 12/1990 |
|---|---|---|
| EP | 0 735 006 | 10/1996 |
| JP | 02 102139 | 4/1990 |
| JP | 09 052722 | 2/1997 |

OTHER PUBLICATIONS

Patent Abstracts of Japan vol. 14, No. 306 and JP 02 102139.
Patent Abstracts of Japan vol. 97, No. 6 and JP 09 052722.

* cited by examiner

Primary Examiner—S. Rosasco
(74) Attorney, Agent, or Firm—Millen, White, Zelano & Branigan, P.C.

(57) ABSTRACT

A synthetic quartz glass substrate is prepared by annealing a synthetic quartz glass member having a higher hydroxyl content in a peripheral portion than in a central portion, machining off the peripheral portion of the member, slicing the member into a plate shaped substrate, chamfering and etching the substrate. The synthetic quartz glass substrate has a minimized birefringence and is suited for use as a photomask in photolithography.

19 Claims, 1 Drawing Sheet

SYNTHETIC QUARTZ GLASS SUBSTRATE FOR PHOTOMASK AND MAKING METHOD

This invention relates to a synthetic quartz glass substrate for use as a photomask and a method for preparing the same.

BACKGROUND OF THE INVENTION

Conventional aligners for photolithography are generally classified into a transmission optical system and a reflection optical system.

When unpolarized plane waves are transmitted by a synthetic quartz glass substrate, the waves divide into two plane-polarized waves which are orthogonal to each other, owing to the birefringence caused by thermal or dynamic stresses in the glass. Since these two plane-polarized waves propagate through the glass at different velocities, they are different in phase upon emergence from the glass, becoming elliptical polarization. When the light transmitted by the substrate is reflected by a mirror of the reflection optical system, a difference in reflectance arises at the mirror surface because the two plane-polarized waves have different electromagnetic vectors. Then the optical intensity of reflected light varies if the birefringence is variant within the substrate.

This phenomenon is further enhanced where a concave mirror is used for reflection because the light reflectance which is affected by the incident angle of light varies among different positions on the concave mirror.

Therefore, if a synthetic quartz glass substrate having a noticeable birefringence is used as the photomask in the aligner based on the reflection optical system, there arises the phenomenon that the light intensity varies over the wafer. Therefore, when the aligner based on the reflection optical system is used, the light sensitivity of a resist coated on a silicon wafer varies within its plane, preventing uniform patterning. The problem becomes more serious as the line width of the pattern becomes narrower.

A variation of light intensity due to birefringence also occurs in the aligner based on the transmission optical system, though the influence is small as compared with the above reflection optical system. Its influence on the exposure of a miniature pattern is of some concern.

It is known that the birefringence in glass is caused by residual stresses therein (see "The World of Quartz Glass," Kogyo Chosakai). To solve such problems, it is generally practiced to effect annealing treatment on a synthetic quartz glass block, by holding the block at a temperature above the annealing point for a time and gradually lowering the temperature below the strain point for reducing thermal residual stresses (see Glass Handbook, Asakura Publishing K.K.). The annealing treatment is followed by slicing, chamfering, and polishing, thereby producing a synthetic quartz glass substrate.

However, even if such a process is employed, the completed synthetic quartz glass substrate for photomask use has a birefringence which is not only as high as about 20 nm/cm where it is the highest, but also largely varies within the photomask substrate. If this synthetic quartz glass substrate is used as a photomask, a variation of light intensity occurs on the wafer surface, especially in the aligner of the reflection optical system, resulting in a failure to define a miniature circuit with a constant line width.

Therefore, there is a desire to have a synthetic quartz glass substrate having a minimized birefringence and useful as a photomask.

SUMMARY OF THE INVENTION

An object of the invention is to provide a synthetic quartz glass substrate for use as a photomask which has a minimized birefringence and which when used as a photomask on a wafer, allows exposure light to distribute at a uniform intensity over the wafer for ensuring a uniform light intensity within the wafer plane for achieving a high patterning precision. Another object of the invention is to provide a method for preparing the synthetic quartz glass substrate.

It has been found that when a synthetic quartz glass member having a higher hydroxyl content in a peripheral portion than in a central portion is annealed, the resulting synthetic quartz glass is suitable as a substrate for photomask use. The annealing step results in the member in which the properties of the peripheral portion are locally altered. The substrate is prepared by machining off the peripheral portion of the annealed member, and slicing the member into a plate shaped substrate, followed by chamfering and etching. The synthetic quartz glass substrate thus obtained has a minimized birefringence, typically up to 2 nm/cm. When used as a photomask on a wafer in an aligner of the reflection optical system, it allows exposure light to distribute at a uniform intensity over the wafer. This ensures a uniform light intensity within the wafer plane, achieving a high precision of patterning.

According to a first aspect, the invention provides a synthetic quartz glass substrate for use as a photomask, obtained by annealing a synthetic quartz glass member having a higher hydroxyl content in a peripheral portion than in a central portion. Preferably, the synthetic quartz glass has a birefringence of up to 2 nm/cm.

According to a second aspect, the invention provides a method for preparing the above-defined substrate, comprising the steps of annealing a synthetic quartz glass member having a higher hydroxyl content in a peripheral portion than in a central portion, and cutting the member into a plate shaped substrate. The method preferably includes the steps of machining the annealed member to remove the peripheral portion whose properties have been locally altered by the annealing step, cutting the member into a plate shaped substrate, chamfering the substrate, and etching the substrate.

BRIEF DESCRIPTION OF THE DRAWINGS

The only FIGURE.

DESCRIPTION OF THE PREFERRED EMBODIMENT

Figure 1:
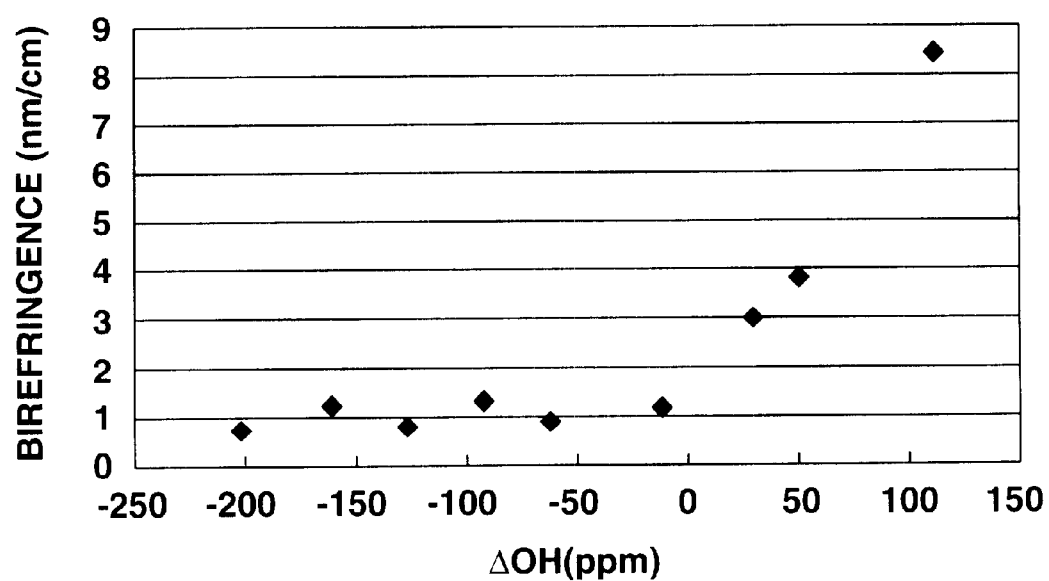
FIG. 1 is a diagram showing the difference in hydroxyl content between central and peripheral portions of a synthetic quartz glass block and the birefringence of a corresponding substrate after annealing and processing in Experiment.

The synthetic quartz glass substrate of the invention is made of synthetic quartz glass obtained by annealing a synthetic quartz glass member having a higher hydroxyl content in a peripheral portion than in a central portion.

The starting material is a synthetic quartz glass member consisting of a peripheral portion and a central portion wherein the hydroxyl content of the peripheral portion is higher than the hydroxyl content of the central portion. The hydroxyl contents in peripheral and central portions of the member and their ratio are not critical as long as the hydroxyl content of the peripheral portion is higher than the hydroxyl content of the central portion. The central portion preferably has a hydroxyl content of 400 to 600 ppm, and more preferably 400 to 500 ppm. The difference of hydroxyl content between central and peripheral portions, represented by ΔOH, that is the hydroxyl content of the central portion minus the hydroxyl content of the peripheral portion, is preferably −150 ppm to −300 ppm, and especially −100 ppm to −200 ppm. It is noted that the hydroxyl content is determined by measuring the absorption of hydroxyl groups by means of an infrared spectrophotometer.

The synthetic quartz glass of which the substrate of the invention is constructed is one obtained by annealing such a synthetic quartz glass member. The synthetic quartz glass as annealed preferably has a birefringence of up to 2 nm/cm, and especially up to 1 nm/cm. A synthetic quartz glass substrate having a greater birefringence, when used as a photomask in a reflection optical system, allows for a substantial difference in exposure dose over the wafer surface, which in turn, may cause a difference in resist irradiation, failing to form a fine pattern.

The synthetic quartz glass substrate can be prepared by annealing a synthetic quartz glass member having a higher hydroxyl content in a peripheral portion than in a central portion, and cutting the member into a plate shaped substrate.

Like conventional synthetic quartz glass, the synthetic quartz glass member as the starting material can be prepared from silicon tetrachloride or silane compounds such as alkoxysilanes by flame oxidation or hydrolysis in an oxyhydrogen flame. Illustratively, direct, indirect and sol-gel processes are useful. In the direct process, a quartz glass ingot is continuously produced by the high-temperature oxidation or hydrolysis of a chemically synthesized silicon compound. The indirect process involves the high-temperature oxidation or hydrolysis of a chemically synthesized silicon compound to produce a mass of silicon dioxide fines known as soot and vitrification of the soot. In the sol-gel process, silica gel produced by sol-gel reaction is sintered for vitrification at high temperature.

According to the invention, any of these synthetic quartz glass ingots is cut into a block conforming to the desired substrate shape such that the block may have a higher hydroxyl content in a peripheral portion than in a central portion. Alternatively, the ingot may be molded into a block of such configuration. The synthetic quartz glass block may be rectangular or cylindrical in shape.

According to the invention, the synthetic quartz glass block is annealed. The annealing involves holding the block in an electric furnace at a temperature above the strain point, preferably 1,150 to 1,300° C. for ½ to 2 hours, and slowly cooling to a temperature below the annealing point, preferably a temperature of 900 to 1,150° C. at a rate of 0.5 to 2° C./hour.

If the difference of hydroxyl content between central and peripheral portions of the synthetic quartz glass member, represented by ΔOH, that is the hydroxyl content of the central portion minus the hydroxyl content of the peripheral portion, is positive, the synthetic quartz glass peripheral portion has a lower hydroxyl content. If ΔOH is negative, the synthetic quartz glass peripheral portion has a higher hydroxyl content. The value of ΔOH has the following relation to the birefringence of synthetic quartz glass as annealed.

As is evident from the results of Experiment to be described later, from nearly where the value of ΔOH changes from 0 to positive, that is, from nearly where the hydroxyl content of the central portion turns to be greater than the hydroxyl content of the peripheral portion, the synthetic quartz block as annealed shows a rapid rise of birefringence. On the other hand, if the value of ΔOH is negative, the annealed synthetic quartz glass block has a smaller birefringence as the hydroxyl content of the peripheral portion becomes greater than the hydroxyl content of the central portion. This is probably because the strain point and annealing point which are thermal factors of a synthetic quartz glass substrate generally become lower at a higher hydroxyl content and higher at a lower hydroxyl content.

The above phenomenon is accounted for as follows. In the cooling step of the annealing treatment, when the hydroxyl content of the central portion of a synthetic quartz glass member is lower than that of the peripheral portion, the synthetic quartz glass in the central portion first increases its viscosity so that molecular migration for strain relief is fixed at a certain temperature, and the peripheral portion due to its higher hydroxyl content has a higher viscosity than the central portion so that molecular migration for strain relief is allowed. As the temperature is further lowered, the central portion of the synthetic quartz glass block starts shrinking, and in the peripheral portion, molecules migrate in a direction to mitigate the stress by the shrinkage of the central portion. The occurrence of molecular migration herein also means that synthetic quartz glass changes its own density. That is, the peripheral portion of the synthetic quartz glass member allows for molecular migration without constraint by external forces.

Inversely, when the hydroxyl content of the peripheral portion of a synthetic quartz glass block is lower than that of the central portion, it is the peripheral portion where molecular migration is first constrained in the cooling step. That is, the interior of the block is as if it were contained in a closed container. This state necessarily causes molecules in the central portion of the block to migrate under constraint by external forces, producing greater stresses than the above-mentioned stresses. As a consequence, the synthetic quartz glass after annealing has a greater birefringence.

Thereafter, the synthetic quartz block as annealed is cut into a desired plate shape by a conventional means, for example, inside blade cutting. The plate-shaped glass is lapped or polished with loose abrasives, surface ground with an abrasive such as cerium oxide or colloidal silica, yielding a synthetic quartz glass substrate for photomask use.

In the preferred embodiment of the invention, the peripheral portion whose properties have been locally altered by the annealing step is machined off from the annealed synthetic quartz glass member, and the substrate is chamfered and etched to a depth of at least 1 μm. This results in a synthetic quartz glass substrate having a further minimized birefringence.

In the synthetic quartz block as annealed, it is sometimes observed that the outermost peripheral portion has a significantly increased birefringence. It is believed that by the heat involved in the annealing treatment, hydroxyl groups near the peripheral surface of the synthetic quartz block undergo the following reaction.

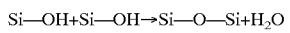

In this way, the hydroxyl groups are discharged out of the synthetic quartz block as water molecules. Then the properties of the synthetic quartz block are locally altered.

It is then desirable to machine off the peripheral surface which has been affected by the above reaction. The extent of material removal may be suitably determined in accordance with the manufacture yield and the desired birefringence value. Preferably the peripheral surface is machined off to an inward depth of at least 3 mm, yielding a synthetic quartz block having a lower birefringence in its entirety. If the extent of machining or removal of the peripheral surface is too small, the thermal influence in proximity to the synthetic quartz block surface may be left behind.

After the quartz block produced by the above method is surface polished with an abrasive, it is cut into a plate-shaped substrate by a conventional means, for example, inside blade cutting. The substrate is finished by machining or chamfering the end surfaces of the substrate. In connection with this step, the mechanical stress strain based on the residual stresses by the working of substrate end surfaces can be introduced in the interior of the synthetic quartz glass substrate to cause birefringence. The cause is supposed to be that in working a quartz substrate for photomask use, the residual stresses by machining or chamfering as above cause birefringence.

In general, such residual stresses by machining can be almost removed by grinding off the work stressed layer. Usually, the end surfaces of the photomask substrate are also ground to a mirror finish. In this step, due to a variation of grinding allowance, some residual stresses by machining can be left behind. Then for the consistent production of low birefringence substrates, the chamfered substrate is etched with an etchant such as hydrofluoric acid (HF) to a depth of at least 1 $\mu$m, preferably 1 to 3 $\mu$m, and especially 1 to 2 $\mu$m, prior to mirror finishing. The etching removes the residual stresses by machining, ensuring the consistent production of low birefringence substrates. A too small etching depth may fail to completely remove the residual stresses by machining. A too large etching depth achieves no further effect and rather worsens the efficiency.

The synthetic quartz glass substrate thus produced according to the invention can be used as a photomask in a photolithographic aligner of the transmission or reflection optical system, and especially advantageously in an aligner of the reflection optical system.

EXAMPLE

Examples of the invention are given below by way of illustration and not by way of limitation.

Experiment

The relationship of the hydroxyl content of a synthetic quartz glass member to the birefringence of synthetic quartz glass after annealing was examined by the following procedure.

Procedure

A synthetic quartz glass block of 158 mm×158 mm×200 mm was annealed. Peripheral surfaces of the block were machined off to dimensions of 152 mm×152 mm×200 mm. The block was sliced into a plate-shaped substrate, which was chamfered. End surfaces of the substrate were etched 1 $\mu$m with HF. Subsequent polishing yielded a synthetic quartz glass substrate of 6.4 mm thick for photomask use. The $\Delta$OH (central portion's hydroxyl content minus peripheral portion's hydroxyl content) of the synthetic quartz glass block and the maximum birefringence of the substrate were measured by the following procedures. The results are shown in FIG. 1.

$\Delta$OH Measurement

Sample pieces of 10 mm thick were cut out from the central and peripheral portions of the synthetic quartz glass block. The absorption of hydroxyl groups was measured by an infrared spectrophotometer. The hydroxyl content of the central portion minus the hydroxyl content of the peripheral portion was calculated.

Birefringence Measurement

Birefringence was measured over the entire surface of the synthetic quartz glass substrate by a birefringence meter model ABR-10A (Uniopt K.K.). The maximum value is the birefringence of the substrate.

As seen from FIG. 1, from nearly where the value of $\Delta$OH changes from 0 to positive, that is, from nearly where the hydroxyl content of the central portion turns to be greater than the hydroxyl content of the peripheral portion, the synthetic quartz glass as annealed shows a rapid rise of birefringence. On the other hand, if the value of $\Delta$OH is negative, the synthetic quartz glass as annealed has a smaller birefringence as the hydroxyl content of the peripheral portion becomes greater than the hydroxyl content of the central portion.

EXAMPLE 1

From synthetic quartz deposited and grown on a target by hydrolysis of silicon tetrachloride in oxyhydrogen flame, a synthetic quartz block of 158 mm×158 mm×230 mm having a $\Delta$OH of −200 ppm was prepared.

It is noted that the $\Delta$OH (central portion's hydroxyl content minus peripheral portion's hydroxyl content) of the synthetic quartz block was determined by slicing sample pieces of 10 mm thick from the upper, central and lower portions of the block, measuring the birefringence before annealing by a birefringence meter and measuring the absorption of hydroxyl groups by an infrared spectrometer.

After the slicing of the sample pieces, there were left two blocks of 158 mm×158 mm×100 mm. One block was annealed by placing it in a Kanthal furnace where it was heated and held at a maximum temperature of 1,300° C. for 2 hours, and slowly cooled at a rate of 1° C./hour to a limit temperature of 900° C.

After the annealing, the peripheral sides of the synthetic quartz block were ground off to a depth of 3 mm on each side by a diamond wheel, obtaining a block of 152 mm×152 mm×100 mm. The block was sliced into a plate of 7 mm thick by an inside blade cutter. The plate was chamfered by a diamond wheel #600. Thereafter, the end surfaces of the plate were etched 1 $\mu$m with 10 wt % hydrofluoric acid, and the entire surfaces were polished with cerium oxide to a mirror finish, obtaining a synthetic quartz glass substrate of 152 mm×152 mm×6.35 mm.

Birefringence was measured over the entire surface of the synthetic quartz glass substrate by a birefringence meter model ABR-10A (Uniopt K.K.). The maximum value is the birefringence of the substrate.

EXAMPLE 2

A synthetic quartz glass substrate was produced as in Example 1 except that the starting synthetic quartz glass block had a $\Delta$OH of −10 ppm. Birefringence was similarly determined.

EXAMPLE 3

A synthetic quartz glass substrate was produced as in Example 1 except that the synthetic quartz glass block prior to annealing was dimensioned 162 mm×162 mm×230 mm and the peripheral sides of the synthetic quartz block after annealing were ground off to a depth of 5 mm. Birefringence was similarly determined.

EXAMPLE 4

A synthetic quartz glass substrate was produced as in Example 1 except that the end surfaces of the plate were etched 2 μm with 10 wt % hydrofluoric acid. Birefringence was similarly determined.

EXAMPLE 5

A synthetic quartz glass substrate was produced as in Example 1 except that the synthetic quartz glass block prior to annealing was dimensioned 152 mm×152 mm×230 mm and the peripheral sides of the synthetic quartz block after annealing were not ground. Birefringence was similarly determined.

EXAMPLE 6

A synthetic quartz glass substrate was produced as in Example 1 except that the end surfaces of the plate were etched 0.5 μm with 10 wt % hydrofluoric acid. Birefringence was similarly determined.

Comparative Example 1

A synthetic quartz glass substrate was produced as in Example 1 except that the starting synthetic quartz glass block had a ΔOH of +50 ppm. Birefringence was similarly determined.

The results of Examples 1 to 6 and Comparative Example 1 are shown in Table 1.

TABLE 1

| Example | ΔOH (ppm) | Peripheral grinding depth (mm) | Depth of edge surface etching (μm) | Birefringence of substrate (nm/cm) |
|---|---|---|---|---|
| E1 | −200 | 3 | 1 | 0.9 |
| E2 | −10 | 3 | 1 | 1.2 |
| E3 | −200 | 5 | 1 | 0.7 |
| E4 | −200 | 3 | 2 | 0.6 |
| E5 | −200 | 0 | 1 | 1.9 |
| E6 | −200 | 3 | 0.5 | 2.8 |
| CE1 | +50 | 3 | 1 | 3.8 |

The synthetic quartz glass substrate of the invention has a minimized birefringence and when used as a photomask on a wafer, especially in an aligner of the reflection optical system, allows exposure light to distribute at a uniform intensity over the wafer for ensuring a uniform light intensity within the wafer plane for achieving a high patterning precision. The substrate is widely used as a photomask. The method of the invention is successful in preparing the synthetic quartz glass substrate in an industrially advantageous manner.

Japanese Patent Application No. 11-141213 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A synthetic quartz glass substrate for use as a photomask, obtained by annealing a synthetic quartz glass member having a higher hydroxyl content in a peripheral portion than in a central portion,
wherein said central portion of said synthetic quartz glass member has a hydroxyl content of 400–600 ppm.

2. The synthetic quartz glass substrate of claim 1 having a birefringence of up to 2 nm/cm.

3. A method for preparing the synthetic quartz glass substrate of claim 1, comprising the steps of annealing a synthetic quartz glass member having a higher hydroxyl content in a peripheral portion than in a central portion, and cutting the member into a plate shaped substrate.

4. The method of claim 3 wherein the annealing step results in the member in which the properties of the peripheral portion are locally altered, and
said method includes the steps of machining off the peripheral portion of the annealed member, cutting the member into a plate shaped substrate, chamfering the substrate, and etching the substrate.

5. A method for preparing a synthetic quartz glass substrate comprising annealing a synthetic quartz glass member having a higher hydroxyl content in a peripheral portion than in a central portion,
wherein said central portion of said synthetic quartz glass member has a hydroxyl content of 400–600 ppm.

6. A synthetic quartz glass substrate obtained by the process according to claim 5.

7. A synthetic quartz glass substrate according to claim 6, wherein the central portion of the substrate has a hydroxyl content of 400–500 ppm.

8. A synthetic quartz glass substrate according to claim 6, wherein said substrate has a birefringence of up to 2 nm/cm.

9. A synthetic quartz glass substrate according to claim 6, wherein said substrate has a birefringence of up to 1 nm/cm.

10. A process according to claim 5, further comprising machining off the peripheral portion of the annealed synthetic quartz glass member.

11. A synthetic quartz glass substrate obtained by the process according to claim 10.

12. A process according to claim 10, further comprising cutting the annealed member into a plate shaped substrate, chamfering said substrate, and etching said substrate.

13. A process according to claim 12, wherein said substrate is etched to a depth of at least 1 μm.

14. A process according to claim 12, wherein said substrate is etched to a depth of 1–3 μm.

15. A process according to claim 12, wherein said substrate is etched to a depth of 1–2 μm.

16. A process according to claim 5, wherein central portion of said synthetic quartz glass member has a hydroxyl content of 400–500 ppm.

17. A process according to claim 5, wherein hydroxyl content of the central portion minus the hydroxyl content of the peripheral portion is −150 ppm to −300 ppm.

18. A process according to claim 5, wherein hydroxyl content of the central portion minus the hydroxyl content of the peripheral portion is −100 ppm to −200 ppm.

19. A process according to claim 5, wherein annealing is performed by holding the synthetic quartz glass member at a temperature of 1150–1300° C. for 0.5–2 hours and then cooling to a temperature of below the annealing point at a rate of 0.5–2° C./hour.

* * * * *